(12) United States Patent
Tsutsui

(10) Patent No.: US 9,650,245 B2
(45) Date of Patent: May 16, 2017

(54) ORGANIC ELECTROLUMINESCENT DEVICE

(75) Inventor: Tetsuo Tsutsui, Fukuoka (JP)

(73) Assignee: Semiconductor Energy Laboratory Co., Ltd. (JP)

(*) Notice: Subject to any disclaimer, the term of this patent is extended or adjusted under 35 U.S.C. 154(b) by 507 days.

(21) Appl. No.: 11/811,437

(22) Filed: Jun. 8, 2007

(65) Prior Publication Data

US 2007/0243786 A1 Oct. 18, 2007

Related U.S. Application Data

(63) Continuation of application No. 10/626,024, filed on Jul. 24, 2003, now Pat. No. 7,239,081.

(30) Foreign Application Priority Data

Aug. 9, 2002 (JP) .................................. 2002-233558

(51) Int. Cl.
| | |
|---|---|
| *H01L 21/00* | (2006.01) |
| *B82Y 30/00* | (2011.01) |
| *B82Y 20/00* | (2011.01) |
| *H01L 51/50* | (2006.01) |
| *H01L 51/52* | (2006.01) |

(52) U.S. Cl.
CPC .............. *B82Y 30/00* (2013.01); *B82Y 20/00* (2013.01); *H01L 51/5012* (2013.01); *H01L 51/5096* (2013.01); *H01L 51/5278* (2013.01); *H01L 2251/564* (2013.01); *Y10S 428/917* (2013.01)

(58) Field of Classification Search
CPC ................................................. H01L 2251/564

USPC ................................................ 427/64, 66–68
See application file for complete search history.

(56) References Cited

U.S. PATENT DOCUMENTS

| | | |
|---|---|---|
| 4,871,236 A | 10/1989 | Gemma et al. |
| 4,971,919 A | 11/1990 | Yamazaki |
| 5,085,946 A | 2/1992 | Saito et al. |

(Continued)

FOREIGN PATENT DOCUMENTS

| | | |
|---|---|---|
| CN | 1272868 | 11/2000 |
| EP | 0 215 683 B1 | 8/1992 |

(Continued)

OTHER PUBLICATIONS

Schmitt et al., "Metal Nanoparticle/Polymer Superlattice Films: Fabrication and Control of Layer Structure," 1997, Adv. Mater. 9, pp. 61-65.*

(Continued)

*Primary Examiner* — Robert Vetere
(74) *Attorney, Agent, or Firm* — Husch Blackwell LLP

(57) ABSTRACT

An organic EL device that has good yields and high reliability as well as high current efficiency is provided by introducing the new concept to the conventional organic EL device structure. An EL device comprising a first electrode 101, a second electrode 102, an electroluminescent layer 103, conductive particles 104, wherein conductive particles 104 are dispersed in the EL layer 103, is used. Current efficiency will be increased since conductive particles serve as the conventional charge generation layer. In addition, fabricating processes will become simplified and fabricating costs will be reduced because the conductive particles and the EL layer can be formed simultaneously.

10 Claims, 4 Drawing Sheets

(56) References Cited

U.S. PATENT DOCUMENTS

| | | | |
|---|---|---|---|
| 5,200,668 A * | 4/1993 | Ohashi et al. | 313/498 |
| 5,478,777 A | 12/1995 | Yamazaki | |
| 5,643,829 A * | 7/1997 | Kang | 313/503 |
| 5,677,546 A | 10/1997 | Yu | |
| 5,682,043 A | 10/1997 | Pei et al. | |
| 5,858,561 A | 1/1999 | Epstein et al. | |
| 5,896,006 A * | 4/1999 | Kusaka et al. | 313/506 |
| 5,970,318 A | 10/1999 | Choi et al. | |
| 5,982,345 A | 11/1999 | Takayama et al. | |
| 6,013,384 A | 1/2000 | Kido et al. | |
| 6,023,128 A | 2/2000 | Grothe et al. | |
| 6,107,734 A | 8/2000 | Tanaka et al. | |
| 6,198,091 B1 | 3/2001 | Forrest et al. | |
| 6,198,092 B1 | 3/2001 | Bulovic et al. | |
| 6,255,774 B1 | 7/2001 | Pichler | |
| 6,278,055 B1 | 8/2001 | Forrest et al. | |
| 6,297,495 B1 | 10/2001 | Bulovic et al. | |
| 6,300,612 B1 | 10/2001 | Yu | |
| 6,352,777 B1 | 3/2002 | Bulovic et al. | |
| 6,372,154 B1 | 4/2002 | Li | |
| 6,406,804 B1 | 6/2002 | Higashi et al. | |
| 6,423,429 B2 | 7/2002 | Kido et al. | |
| 6,451,415 B1 | 9/2002 | Forrest et al. | |
| 6,452,092 B2 | 9/2002 | Han et al. | |
| 6,483,123 B1 | 11/2002 | Kim et al. | |
| 6,489,044 B1 | 12/2002 | Chen et al. | |
| 6,524,884 B1 | 2/2003 | Kim et al. | |
| 6,579,564 B2 | 6/2003 | Chen et al. | |
| 6,580,213 B2 | 6/2003 | Yamazaki | |
| 6,632,543 B1 * | 10/2003 | Kawamura | 428/690 |
| 6,692,820 B2 | 2/2004 | Forrest et al. | |
| 6,696,105 B2 | 2/2004 | Hiroki et al. | |
| 6,740,938 B2 | 5/2004 | Tsunoda et al. | |
| 6,773,831 B2 | 8/2004 | Higashi et al. | |
| 6,777,706 B1 | 8/2004 | Tessler et al. | |
| 6,835,803 B1 | 12/2004 | Ho et al. | |
| 6,844,025 B2 | 1/2005 | Forrest et al. | |
| 7,008,999 B2 | 3/2006 | Ho et al. | |
| 7,279,524 B2 | 10/2007 | Ho et al. | |
| 7,291,969 B2 | 11/2007 | Tsutsui | |
| 2001/0000744 A1 * | 5/2001 | Wolk et al. | 430/200 |
| 2001/0031509 A1 | 10/2001 | Yamazaki | |
| 2001/0042853 A1 * | 11/2001 | Hampden-Smith et al. | 252/301.4 R |
| 2001/0046611 A1 | 11/2001 | Kido et al. | |
| 2002/0022151 A1 * | 2/2002 | Ishikawa | C07C 211/61 428/690 |
| 2002/0028347 A1 * | 3/2002 | Marrocco, III | C08G 61/10 428/690 |
| 2002/0070385 A1 * | 6/2002 | Yamagata | H01L 27/12 257/93 |
| 2002/0105080 A1 | 8/2002 | Speakman | |
| 2002/0119297 A1 | 8/2002 | Forrest et al. | |
| 2002/0119724 A1 * | 8/2002 | Hammel | H01J 9/261 445/24 |
| 2002/0140338 A1 * | 10/2002 | Sluzky | 313/461 |
| 2002/0146589 A1 * | 10/2002 | Akiyama et al. | 428/690 |
| 2002/0149025 A1 * | 10/2002 | Andriessen | C09K 11/574 257/98 |
| 2002/0153830 A1 * | 10/2002 | Andriessen | 313/498 |
| 2002/0189666 A1 | 12/2002 | Forrest et al. | |
| 2002/0197462 A1 | 12/2002 | Forrest et al. | |
| 2003/0025166 A1 | 2/2003 | Yamazaki et al. | |
| 2003/0035979 A1 | 2/2003 | Chen et al. | |
| 2003/0042846 A1 | 3/2003 | Forrest et al. | |
| 2003/0047816 A1 * | 3/2003 | Dutta | B82Y 30/00 257/788 |
| 2003/0094626 A1 * | 5/2003 | Duggal et al. | 257/184 |
| 2003/0127967 A1 | 7/2003 | Tsutsui et al. | |
| 2003/0189210 A1 * | 10/2003 | Yamazaki et al. | 257/72 |
| 2003/0189401 A1 | 10/2003 | Kido et al. | |
| 2003/0193792 A1 * | 10/2003 | Chang | 361/778 |
| 2003/0209974 A1 | 11/2003 | Yamazaki | |
| 2003/0218166 A1 | 11/2003 | Tsutsui | |
| 2004/0027059 A1 | 2/2004 | Tsutsui | |
| 2004/0027061 A1 | 2/2004 | Seo et al. | |
| 2004/0109995 A1 * | 6/2004 | Wakiya et al. | 428/328 |
| 2004/0113546 A1 | 6/2004 | Forrest et al. | |
| 2004/0151887 A1 | 8/2004 | Forrest et al. | |
| 2004/0256620 A1 | 12/2004 | Yamazaki et al. | |
| 2005/0023522 A1 | 2/2005 | Frey et al. | |
| 2008/0146744 A1 | 6/2008 | Ho et al. | |

FOREIGN PATENT DOCUMENTS

| | | |
|---|---|---|
| EP | 0 855 848 A2 | 7/1998 |
| EP | 0 948 063 A2 | 10/1999 |
| EP | 0 992 564 A1 | 4/2000 |
| EP | 1 024 394 A1 | 8/2000 |
| EP | 1 065 737 A2 | 1/2001 |
| EP | 1 081 774 A2 | 3/2001 |
| EP | 1107298 * | 6/2001 |
| EP | 1 128 449 A2 | 8/2001 |
| EP | 1 432 051 A2 | 6/2004 |
| EP | 1 995 800 A2 | 11/2008 |
| JP | 60-28278 | 2/1985 |
| JP | 2-291696 | 12/1990 |
| JP | 4-192376 | 7/1992 |
| JP | 5-59356 | 3/1993 |
| JP | 6-318725 | 11/1994 |
| JP | 8-78164 | 3/1996 |
| JP | 11-126685 | 3/1996 |
| JP | 8-288069 | 11/1996 |
| JP | 9-328680 | 12/1997 |
| JP | 10-270171 | 10/1998 |
| JP | 10-513603 | 12/1998 |
| JP | 11-505367 | 5/1999 |
| JP | 11-162646 | 6/1999 |
| JP | 11-251067 | 9/1999 |
| JP | 11-329748 | 11/1999 |
| JP | 11-329749 | 11/1999 |
| JP | 2001-244074 | 9/2001 |
| JP | 2001-291592 | 10/2001 |
| JP | 2001-357975 | 12/2001 |
| JP | 2002-33193 | 1/2002 |
| JP | 2002-93574 | 3/2002 |
| JP | 2002-164170 | 6/2002 |
| JP | 2003-045676 | 2/2003 |
| JP | 2003-515933 | 5/2003 |
| JP | 2004-111085 | 4/2004 |
| TW | 494705 | 7/2002 |
| TW | 495809 | 7/2002 |
| WO | WO 96/26830 A1 | 9/1996 |
| WO | WO 00/04593 A1 | 1/2000 |
| WO | WO 0004593 A1 * | 1/2000 |
| WO | WO 00/45217 A1 | 8/2000 |
| WO | WO 00/60612 A1 | 10/2000 |
| WO | WO 02/101838 A1 | 12/2002 |
| WO | WO 2004/112440 A1 | 12/2004 |

OTHER PUBLICATIONS

Rotman et al., "Defect-property correlations in garnet crysta.Is: The electrical conductivity and defect structure of luminescent cerium-doped yttrium aluminum garnet", Journal of Applied Physics 57, 1951-55 (1985).*

Office Action re Taiwan Patent application No. 92120423, dated Oct. 2, 2007 (with English translation).

Office Action re Chinese Patent application No. 200310027837.X, dated Nov. 2, 2007 (with English translation).

Ferraris, J. et al, "Electron Transfer in a New Highly Conducting Donor-Acceptor Complex," Journal of the American Chemical Society, vol. 95, No. 3, Feb. 7, 1973, pp. 948-949.

Shirakawa, H. et al, "Synthesis of Electrically Conducting Organic Polymers: Halogen Derivatives of Polyacetylene, (CH)x," J.C.S. Chem. Comm., No. 16, 1977, pp. 578-580.

Tang, C.W. et al, "Two-Layer Organic Photovoltaic Cell," Applied Physics Letters, vol. 48, No. 2, Jan. 13, 1986, pp. 183-185.

Tang, C.W. et al, "Organic Electroluminescent Diodes," Appl. Phys. Lett., vol. 51, No. 12, Sep. 21, 1987, pp. 913-915.

(56) References Cited

OTHER PUBLICATIONS

Fuchigami, H. et al, "Polythienylenevinylene Thin-Film Transistor with High Carrier Mobility," Applied Physics Letters, vol. 63, No. 10, Sep. 6, 1993, pp. 1372-1374.

Tsutsui, T., "The Operation Mechanism and the Light Emission Efficiency of the Organic EL Element," Textbook of the 3rd seminar at Division of Organic Molecular Electronics and Bioelectronics, The Japan Society of Applied Physics, 1993, pp. 31-37, (with English translation pp. 1-11).

Gundlach, D.J. et al, "Pentacene Organic Thin-Film Transistors -Molecular Ordering and Mobility," IEEE Electron Device Letters, vol. 18, No. 3, Mar. 1997, pp. 87-89.

Ruhstaller, B. et al, "Bias-Tuned Reduction of Self-Absorption in Polymer Blend Electroluminescence," Chemical Physics Letters, vol. 317, Feb. 4, 2000, pp. 238-244.

Narayan, K.S. et al, "Light Responsive Polymer Field-Effect Transistor," Applied Physics Letters, vol. 79, No. 12, Sep. 17, 2001, pp. 1891-1893.

Sato, Y., "Problem for Implementation in View of Materials Development," The Japan Society of Applied Physics/Organic Molecular Electronics and Bioelectronics, vol. 11, No. 1, 2000, pp. 86-99 (with English abstract).

Kido, J. et al, "High Quantum Efficiency Organic EL Devices Having Charge Generation Layer," Extended Abstracts 49th Japan Society of Applied Physics and Related Societies, abstract 27p-YL-3, Mar. 2002, p. 1308 (with English translation).

U.S. Appl. No. 10/309,843 (pending) to Tsutsui, filed Dec. 4, 2002, including specification, abstract, claims, drawings and PTO filing receipt.

Hiramoto, M. et al, "Effect of Thin Gold Interstitial-Layer on the Photovoltaic Properties of Tandem Organic Solar Cell," Chemistry Letters, 1990, pp. 327-330.

Yu, G. et al, "Charge Separation and Photovoltaic Conversion Polymer Composites with Internal Donor/Acceptor Heterojunctions," J. Appl. Phys., vol. 78, No. 7, Oct. 1, 1995, pp. 4510-4515.

Parthasarathy, G. et al, "A Metal-Free Cathode for Organic Semiconductor Devices," Appl. Phys. Lett., vol. 72, No. 17, Apr. 27, 1998, pp. 2138-2140.

Office Action re Taiwanese Patent application No. TW 96145172, dated Oct. 24, 2008 (with English translation).

European Search Report re application No. EP 03016827.2, dated Jul. 22, 2009.

\* cited by examiner

ORGANIC ELECTROLUMINESCENT DEVICE

This application is a continuation of U.S. application Ser. No. 10/626,024, now U.S. Pat. No. 7,239,081 filed on Jul. 24, 2003.

BACKGROUND OF THE INVENTION

1. Field of the Invention

The present invention relates to an organic electroluminescent device having an organic compound layer that generates light upon application of an electric field.

2. Description of the Related Art

Compared to inorganic compounds, organic compounds have more various material systems and possibilities for synthesizing organic materials to have advanced various functions through appropriate molecular design. Further, things made from the organic compound have characteristics of being flexible, and moreover, having workability by polymerization. In light of these advantages, in recent years, the technique of photonics and electronics employing functional organic materials have been attracted attention.

The technique of photonics utilizing optical properties of organic materials has already played an important role in contemporary industrial technology. For example, photosensitive materials such as a photoresist have become indispensable for a photolithography technique that is used for the micro machining of semiconductors. In addition, since the organic compounds themselves have properties of light absorption and light emission caused by the light absorption (fluorescence or phosphorescence), they are also well suited to light emitting materials for laser pigments or the like.

On the other hand, since organic compounds do not have carriers themselves, they have essentially superior insulation properties. Therefore, with respect to the technique of electronics using electrical properties of organic materials, the almost organic compounds have been conventionally used as insulators such as insulating materials, protective materials, or covering materials.

However, there is means for applying large amounts of current to the organic material that is essentially insulators. The means is increasingly coming into practical use in the electronics field. It can be broadly divided into two categories.

One of the means, as represented by conductive polymers, is that an acceptor (electron acceptor) or a donor (electron donor) is doped to give carriers to the π-conjugate system organic compound (Reference 1: Hideki Shirakawa, Edwin J. Louis, Alan G. MacDiarmid, Chwan K. Chiang, and Alan J. Heeger, "Synthesis of Electrically Conducting Organic Polymers: Halogen Derivatives of Polyacetyrene, (CH)x", Chem. Comm., 1977, 16, 578-580). Since the carriers expand to a certain area with increased the amount of doping, the dark conductivity will also rise along with this, so that large amounts of current will become flow in the organic material.

A part of the means for applying current to the organic material by doping an acceptor or a donor to improve the dark conductivity has already been applied in the electronics field, for example, a rechargeable secondary battery using polyaniline or polyacene, or an electric field condenser using polypyrrole.

The other means for applying large amounts of current to the organic material is utilization of an SCLC (Space Charge Limited Current). The SCLC is the current that starts to flow by injecting a space charge from the outside and transferring. The current density of the SCLC is expressed by Child's Law, i.e., Formula 1 in the following. In the formula, J denotes current density, $\epsilon$ denotes relative permittivity, $\epsilon_0$ denotes permittivity of vacuum, $\mu$ denotes carrier mobility, V denotes a voltage, and d denotes a distance to which the voltage V is applied:

$$J=9/8 \cdot \epsilon \epsilon_0 \mu \cdot V^2/d^3 \qquad \text{Formula 1}$$

Note that Formula 1 that expresses the SCLC does not assume at all carrier-trap generating when the SCLC flows. The electric current limited by carrier-trap is referred to as TCLC (Trap Charge Limited Current) and in proportion to power of the voltage. The rate of both SCLC and TCLC are determined by bulk. Therefore the SCLC is regarded the same as TCLC hereinafter.

Here, for comparison, the current density when Ohm current flows according to Ohm's Law is shown in Formula 2. $\sigma$ denotes a conductivity, and E denotes an electric field strength:

$$J=\sigma E=\sigma \cdot V/d \qquad \text{Formula 2}$$

In Formula 2, since the conductivity $\sigma$ is expressed as $\sigma=ne\mu$ (where n denotes a carrier density, and e denotes an electric charge), the carrier density is included in the factors controlling the amount of current. Therefore, unless increase of the carrier density by doping as described above is attempted to an organic material having a certain degree of carrier mobility, the Ohm current will not flow in the organic material in which carriers hardly exist usually.

However, as shown in Formula 1, the determination factors of SCLC are the permittivity, the carrier mobility, the voltage, and the distance to which the voltage is applied. The carrier density is irrelevant. In other words, it is possible to inject a carrier from the outside and to apply the current to the organic material even an organic material is an insulator having no carriers by making the distance d sufficiently small and by using a material having significant carrier mobility $\mu$.

When this means is used, the amount of current in the organic material is as much as or more than that of a common semiconductor. Thus, an organic material with high carrier mobility $\mu$, in other words, an organic material capable of transporting potentially a carrier, can be referred to as an "organic semiconductor".

Incidentally, organic electroluminescent devices (hereinafter, organic EL devices) achieve a striking prosperity in recent years as photoelectronic devices which utilize both photonics and electrical qualities of functional organic materials among organic semiconductor devices which use the SCLC.

The most basic structure of the organic EL device was reported by W. Tang, et al. in 1987 (Reference 2: C. W. Tang and S. A. Vanslyke, "Organic electroluminescent diodes", Applied Physics Letters, Vol. 51, No. 12, 913-915 (1987)).

The device reported in Reference 2 is a type of diode element in which electrodes sandwich an organic thin film to have a total thickness of approximately 100 nm that is formed by laminating a hole-transporting organic compound and an electron-transporting organic compound. For the electron-transporting compound, a light emitting material (fluorescent material) is used. By applying voltage to the device, light-emission can be extracted to outside as a light emitting diode.

The light-emission mechanism is considered as follows. By applying the voltage to the organic thin film sandwiched by the electrodes, the hole and the electron injected from the electrodes are recombined inside the organic thin film, and formed to be an excited molecule (hereinafter, referred to as a "molecular exciton"), and then, light is emitted when this molecular exciton returns to its base state.

Note that, singlet and triplet excitons formed by the organic compound can be utilized. Since the base state is normally the singlet state, the light emission from the singlet excited state is referred to as fluorescent light, and the light emission from the triplet excited state is referred to as phosphorescent light. In this specification, the light emission from either excited states will be described.

In the above-described organic EL device, the organic thin film is normally formed into a thin film to have a thickness of about 100 to 200 nm. Further, since the organic EL device is a self-luminous device in which light is generated in the organic thin film itself, a backlight that is used in a conventional liquid crystal display is not necessary. Therefore, the organic EL device has a great advantage of being able to be manufactured to be ultrathin and lightweight.

Further, in the thin film having a thickness of about 100 to 200 nm, for example, the amount of time for injecting and recombining of carriers is approximately several tens of nanoseconds taking into consideration of the carrier mobility of the organic thin film. Even if the process of carrier's recombination and light emission can be achieved within on the order of microseconds. Therefore, extremely quick response time can be included in advantages of the organic thin film.

Because of the above-mentioned properties of thin and lightweight, the quick response time, and the like, the organic EL device is attracted an attention as a next generation flat panel display device. Further, since the organic EL display has a high level of visibility from its property of self-luminous and a broad visible range, the organic EL device is expected to be used for display screens of portable devices.

An organic EL device is the device that utilizes means of applying SCLC to an organic semiconductor, but the SCLC intensifies the deterioration of the organic semiconductor function. As to the organic EL device, it is known that the device lifetime (half-life of the luminance) is reduced inversely proportional to the initial luminance, in other words, the amount of current flowing. (Reference 3: Yoshiharu SATO, "The Japan Society of Applied Physics/Organic Molecular Electronics and Bioelectronics", vol. 11, No. 1 (2000), 86-99).

In view of the foregoing, above-mentioned deterioration can be reduced by improving the current efficiency (luminance generating depending on the electric current), since the necessary amount of electric current to achieve a certain luminance can be reduced. Thus, the current efficiency is an important factor for an organic device in view of the device lifetime, not to mention the power consumption.

However, an organic EL device has a problem with respect to the current efficiency. As mentioned above, the light emission mechanism of the organic EL device is that light is converted by recombination of the injected hole and electron with each other. Therefore, in theory, it is possible to extract at most one photon from the recombination of one hole and one electron, and it is impossible to extract a plurality of photons therefrom. That is, the internal quantum efficiency (the number of emitted photons depending on injected carriers) should be at most 1.

However, in reality, it is difficult even to bring the internal quantum efficiency close to 1. For example, in the case of the organic EL device using the fluorescent material as the luminant, the statistical generation ratio of the singlet excited state (S*) and the triplet excited state (T*) is considered to be S*:T*=1:3. Therefore, the theoretical limit of the internal quantum efficiency is 0.25. (Reference 4: Tetsuo TSUTSUI, "Textbook of the 3rd seminar at Division of Organic Molecular Electronics and Bioelectronics, The Japan Society of Applied Physics" (1993), 31-37). Furthermore, as long as the fluorescent quantum yield from the fluorescent material is not $\phi_f$, the internal quantum efficiency will be decreased even lower than 0.25.

In recent years, there has been an attempt to bring the theoretical limit of the internal quantum efficiency close to 0.75 to 1 by using phosphorescent materials obtained from the light emission of the triplet excited state. The internal quantum efficiency has been actually achieved exceeding that of the fluorescent material. However, the range of material choice is unavoidably restricted since a phosphorescent material having high phosphorescent quantum efficiency $\phi_p$ should be used. That is caused by that the organic compounds that can release phosphorescent light at room temperature are extremely scarce.

For this reason, as a means for improving the inferiority of the current efficiency of a device, the concept of a charge generation layer was reported in recent years (Reference 5: M. Herrmann, Junji KIDO, "49th Japan Society of Applied Physics and Related Societies" p. 1308, 27p-YL-3 (March 2002)).

The concept of a charge generation layer is described as illustrated in FIGS. 6A and 6B. FIGS. 6A and 6B are frame formats of the organic EL device disclosed in Reference 5 that is formed by laminating an anode, an electroluminescent layer, a charge generation layer, a second electroluminescent layer, and a cathode. Note that the electroluminescent layer (hereinafter, an EL layer) is a layer including an organic compound that can emit light by injecting carriers. In addition, the charge generation layer does not connect to an external circuit and serves as a floating electrode.

In such an organic EL device, when voltage V is applied to the region between the anode and the cathode, electrons are injected to the first EL layer from the charge generation layer and holes are injected to the second EL layer from the charge generation layer, respectively. When seen from the external circuit, holes are moving from the anode to the cathode and electrons are moving from the cathode to the anode (FIG. 6A). However, it can be also seen that both holes and electrons from the charge generation layer are moving in the reverse direction (FIG. 6B), so that carriers are recombined in both of the first EL layer and the second EL layer, and light is generated. In that case, if the current I is flowing, both of the first EL layer and the second EL layer can release photons depending on the amount of current I, respectively. Therefore, such organic EL device have the advantage of releasing two times amount of light by the same amount of current compared to an organic EL device having only one layer. (However, two times or more amount of voltage is needed compared to the organic EL device having only one layer).

In the organic EL device employing such a charge generation layer, the current efficiency can be improved significantly by laminating a number of EL layers. (However, the structure requires several times or more amount of voltage). Thus, in theory, the device lifetime can be expected to be improved along with the improvement of the current efficiency.

However, when the current efficiency is tried to be improved using a charge generation layer, it is required that a number of EL layers should be laminated and the fabricating process become complicated. Accordingly, the partial defect possibility such as a pinhole is increased. Therefore another defects such as the dispersion of each device, the short-circuit of devices, and the like are apt to be caused.

More EL layers lamination requires longer fabricating time. It has negative effects on increasing throughput for mass production. The fact causes an increase of the cost.

Therefore an organic EL device including a conventional charge generation layer has high current efficiency, however, causes problems such as yields of device or an increase of the cost.

SUMMARY OF THE INVENTION

In view of the foregoing, an object of the present invention is to provide an organic EL device that has good yields and high reliability as well as high current efficiency that is realized by introducing the new concept to the conventional organic EL device structure.

As the result of earnest investigation, the inventors of the present invention have proposed means capable of resolving the problems described above by combining conductive (or semiconductive) dispersed particles having a carrier (hereinafter referred to as "conductive particles") and an organic semiconductor that utilizes SCLC and expresses conductivity and luminescence. The most basic structure thereof is shown in FIGS. 1A and 1B.

FIG. 1A is an organic EL device that includes a first electrode 101, a second electrode 102, an electroluminescent layer (hereinafter referred to as "EL layer") 103, and conductive particles 104. Conductive particles are dispersed in the EL layer 103. Note that the EL layer 103 is a layer that contains an organic compound that emits light upon application of an electric field.

It is essential here that the conductive particles 104 be a material capable of being a nearly ohmic contact with the EL layer 103. In other words, the barriers between the conductive particles 104 and the EL layer 103 are eliminated, or made as small as possible.

Both holes and electrons can easily be injected from the dispersed conductive particles by using this type of structure. This state is shown in FIG. 1B. As shown in the figure regarding one conductive particle 104' among the conductive particles 104, both electrons and holes are injected from the conductive particle to the EL layer in opposite directions due to the application of an electric field (this phenomenon develops similarly in the other conductive particles). Holes from the first electrode 101 (an anode in FIG. 1B) and electrons from the second electrode 102 (a cathode in FIG. 1B) are injected at the same time, and therefore electric current flows in the overall device. That is, although the concept of this phenomenon is similar to that of a charge generation layer, particles are used instead of a layer.

Although the driving voltage increases higher than that of normal devices, the electric current efficiency can be increased by that amount by applying this basic structure of the present invention, similarly to the organic EL device of Non-patent reference 5, which uses the charge generation layer. Moreover, complicated operations in which many layers are laminated can be omitted because a structure may be formed in which conductive particles are dispersed within the EL layer to such an extent that a short circuit does not develop (that is, uniformly). Manufacturing is therefore facilitated as compared with the organic EL device of Non-patent reference 5, which uses a conventional charge generation layer.

According to the present invention, there is provided an organic electroluminescent device including: a first electrode; a second electrode; and an electroluminescent layer containing an organic compound that emits light by the application of a voltage between the first electrode and the second electrode, characterized in that conductive particles are dispersed within the electroluminescent layer.

Further, there is also a fear in that the conductive particles 104 will become locally non-uniform in the device shown in FIGS. 1A and 1B, and that short circuit may be caused by insulation damage and the like. It is therefore preferable to use an organic EL device that includes a first electrode 201, a second electrode 202, an EL layer 203, and conductive particles 204 as shown in FIG. 2A. In the structure of the organic EL device, it is preferable that the conductive particles 204 are dispersed in the EL layer 203, and insulating layers 205a and 205b are formed between the first electrode 201 and the EL layer 203, and between the second electrode 202 and the EL layer 203, respectively. It becomes easy to prevent device short circuits by using this type of structure, and at the same time, the development of leak currents can also be prevented by the existence of the insulating layers 205a and 205b. Thus, improved efficiency can be also expected.

Therefore, according to the present invention, in an organic electroluminescent device including: a first electrode; a second electrode; and an electroluminescent layer containing an organic compound that emits light by the application of a voltage between the first electrode and the second electrode, it is characterized in that conductive particles are dispersed within the electroluminescent layer, and also an insulating layer is disposed between the first electrode and the electroluminescent layer, and an insulating layer is disposed between the second electrode and the electroluminescent layer.

A more preferable structure is designed such that the insulating layers 205a and 205b are made sufficiently thick in the organic EL device of the present invention shown in FIG. 2A so that carriers from the first electrode 201 and the second electrode 202 are not injected. In this case, carriers cannot be injected from the outside, and carrier injection sources (generation sources) can only exist in internal portions of the EL layer 203 (that is, carriers can only be injected from the conductive elements 204). Operation is therefore performed by alternating current drive (FIG. 2B). This procedure is extremely effective in preventing device short circuits, and in particular, can provide devices having superior yield and operational stability.

Therefore, according to the present invention, in an organic electroluminescent device including: a first electrode; a second electrode; and an electroluminescent layer containing an organic compound that emits light by the application of a voltage between the first electrode and the second electrode, it is characterized in that an insulating layer is disposed between the first electrode and the electroluminescent layer for preventing carrier injection from the first electrode to the electroluminescent layer, and an insulating layer is disposed between the second electrode and the electroluminescent layer for preventing carrier injection from the second electrode to the electroluminescent layer.

Further, according to the present invention, in an organic electroluminescent device including: a first electrode; a second electrode; and an electroluminescent layer containing an organic compound that emits light by the application of a voltage between the first electrode and the second electrode, it is characterized in that conductive particles are dispersed within the electroluminescent layer, an insulating layer is disposed between the first electrode and the electroluminescent layer, an insulating layer is disposed between the second electrode and the electroluminescent layer, and also the organic electroluminescent device is operated by an alternating current drive.

Structuring the EL layer by using a single layer structure (that is, a bipolar layer) makes manufacturing easier for the organic EL devices of the present invention, regardless of the structure as in FIGS. 1A and 1B, or FIGS. 2A and 2B, and is therefore preferable. Further, the bipolar layer is particularly preferable when using alternating current drive, in the structure as in FIG. 2B.

There is a procedure for forming the EL layer by using a bipolar layer in which an organic compound having electron transporting characteristics and an organic compound having hole transporting characteristics are mixed. Further, there is a procedure in which a polymeric compound having bipolar characteristics and having a π-conjugate system or a σ-conjugate system is used. The latter in particular has an advantage in that the EL layer can be formed easily by wet coating concurrently with the conductive particles, and is effective in terms of simplicity of film formation.

Note that it is not necessary to use materials having low resistivity for all of the conductive particle materials described above, because carriers may be injected and a certain level of carrier may be present. The conductive particles may therefore contain materials having conductivity equal to or greater than $10^{-10}$ S/m.

Further, the procedure for applying the conductive particles concurrently with the EL layer structural components by wet coating is the simplest one from the standpoint of film formation processing. Metallic particles or inorganic semiconductor particles having an average diameter of 2 nm to 50 nm may be used as suitable materials for this procedure. Particles having gold or silver as their composition are useful as the metallic particles. Further, CdS, CdSe, ZnO, ZnS, CuI, ITO, and the like are useful as the inorganic semiconductor particles. In addition, particles whose surface is covered, by an organic compound may also be used in order to stabilize the particles. It is also effective to use carbon particles, carbon particles that have undergone surface treatment by use of a surfactant, carbon nanotubes, or fullerenes.

DETAILED DESCRIPTION OF THE PREFERRED EMBODIMENTS

Operating principles and specific structural examples are provided and explained in detail below for the preferred embodiments of the present invention. Note that organic EL devices may have one transparent electrode in order to extract emitted light. Therefore, not only is it possible to apply a conventional device structure in which a transparent electrode is formed on a substrate and light is extracted from the substrate side, but it is also possible to apply a structure in which light is extracted from the side opposite to that of the substrate. Further, it is also possible to apply a structure in which light is extracted from both sides.

Figure 1A:
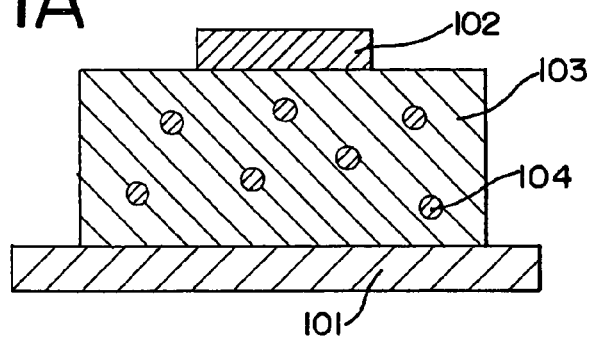
FIGS. 1A and 1B are views showing a basic structure of the present invention.
Figure 1B:
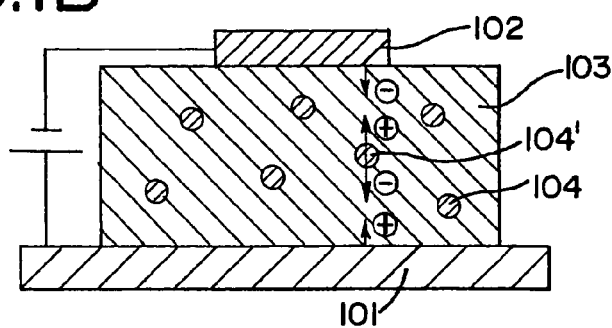
Figure 3A:
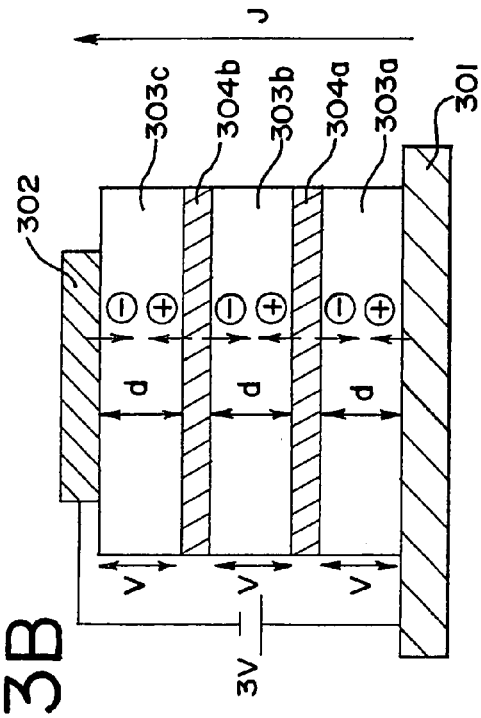
FIGS. 3A to 3C are views showing a concept of a charge generation layer.

An operational mechanism for the organic EL device of the present invention shown in FIGS. 1A and 1B is explained first by using FIGS. 3A to 3C, and FIG. 4. FIG. 3A is a diagram of a normal organic EL device having an device structure in which an EL layer 303 is sandwiched between an anode 301 and a cathode 302. This organic EL device is one in which a current having a current density J flows due to the application of a voltage V, and light having a luminance L, which corresponds to the current density J, is emitted. The current density J is SCLC at this point, and is a factor determined only by a film thickness d and the voltage V when the EL layer 303 material is generally determined (refer to Formula 1 above).

Figure 3B:
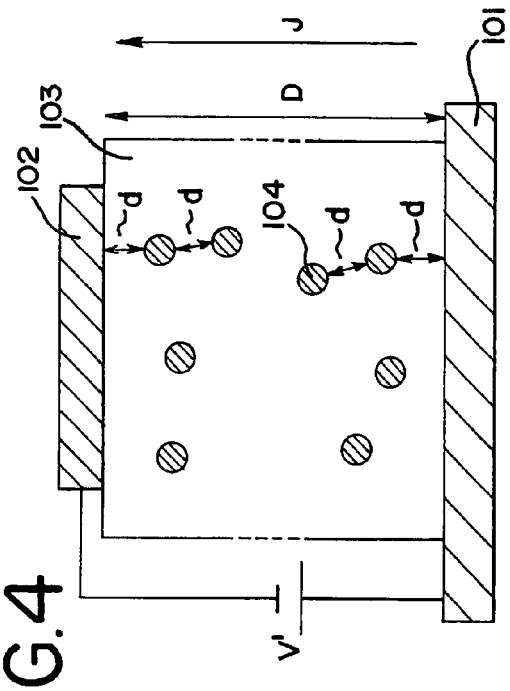

FIG. 3B is a diagram of a three layer laminate of EL layers 303a, 303b, and 303c, which is an example of an device having a charge generation layer discussed in Non-patent reference 5. The voltage V is applied to each of the EL layers having the film thickness d by sandwiching the EL layers with the charge generation layers 304a and 304b, and applying a voltage 3V equal to three time the voltage V. A current having the current density J therefore flows in the overall device. Light is emitted at the luminescence L, corresponding to the current density J in each of the EL layers, and therefore an organic EL device that emits light at a total luminescence of 3 L can be obtained.

Figure 3C:
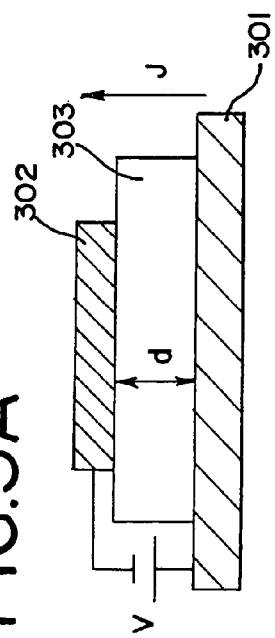

If the charge generation layers 304a and 304b of FIG. 3B are made thinner here, for example, layers (films) ultimately cannot be formed, and cluster shape electric charge generating regions 305a and 305b are formed instead as shown in FIG. 3C. It is conceivable that an organic EL device similar to that of FIG. 3B can also be obtained in this case as well, provided that the cluster shape electric charge generating regions are formed by materials similar to those used for the charge generation layers 304a and 304b.

Figure 4:
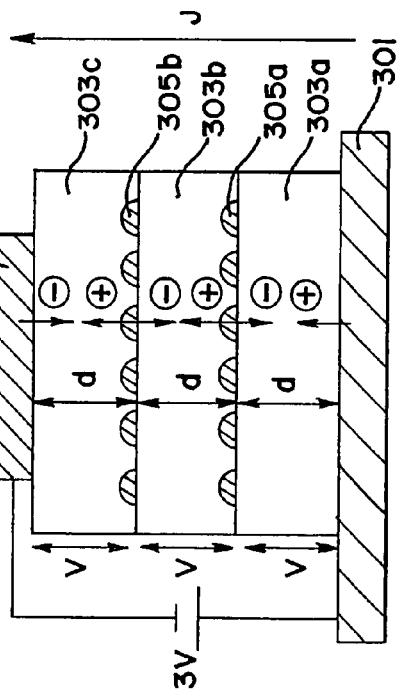
FIG. 4 is a view showing principle of operation.

An organic EL device of the present invention, in which the cluster shape electric charge generating regions 305a and 305b are dispersed evenly over the entire EL layer, is shown in the structure of FIG. 3C. FIG. 4 shows a schematic diagram of the operation thereof. Note that the reference numerals of FIGS. 1A and 1B are cited in FIG. 4.

A current having the current density J, which is of an order sufficient for obtaining light emission, can flow in accordance with the basic principle shown in FIG. 3C by applying a voltage V', which is larger than the voltage V, if the conductive particles 104 are dispersed almost uniformly at a gap on the order of the distance d as shown in FIG. 4 ("~d" in the figure). A film thickness D of the device can of course be made thicker than the film thickness level of a normal organic EL device (on the order of the thickness d). Moreover, a laminate of several layers is not necessary, unlike conventional organic EL devices that use charge generation layers. A simple structure in which the conductive particles are dispersed in a single layer organic EL device can be manufactured.

Figure 2A:
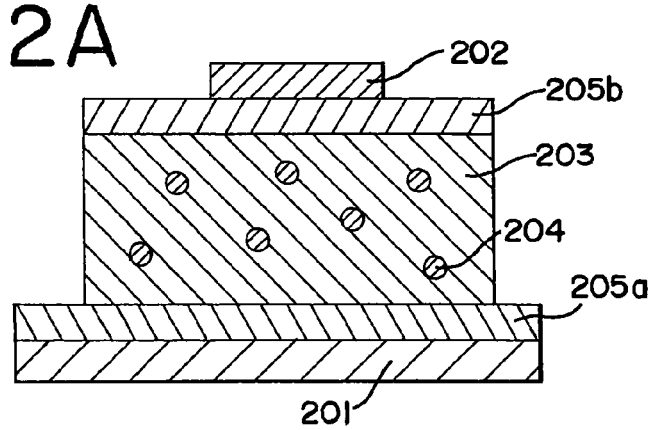
FIGS. 2A and 2B are views showing a basic structure of the present invention.
Figure 2B:
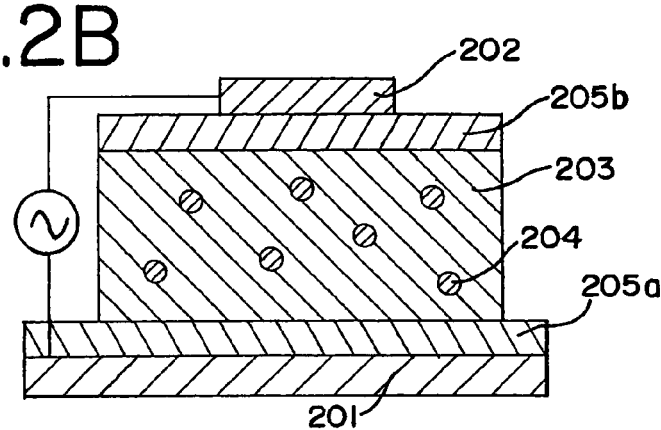

Further, the organic EL device of the present invention shown by FIG. 2A operates by the exact same operation principle as that shown in FIG. 4, provided that the insulating layers 205a and 205b are made thin enough for carriers to be injected. In addition, even if a design is used in which the insulating layers 205a and 205b are made sufficiently thick so that carriers cannot be injected from the first electrode 201 and from the second electrode 202, light emission can be obtained by using alternating current drive (FIG. 2B device). Defects such as device short circuits can be most effectively prevented by using this type of device. The operating principle of the device of FIG. 2B is explained by using FIGS. 5A to 5C.

Figure 5A:
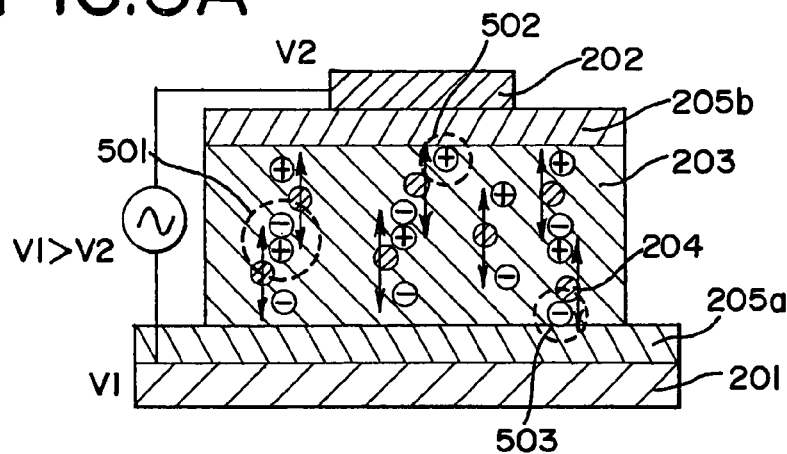
FIGS. 5A to 5C are views showing principle of operation.
Figure 5B:
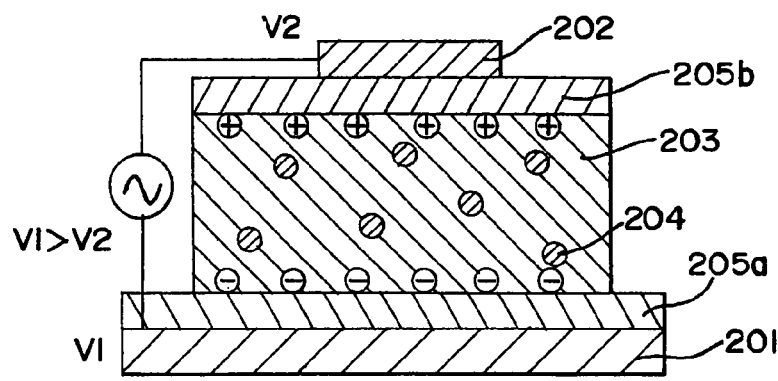
Figure 5C:
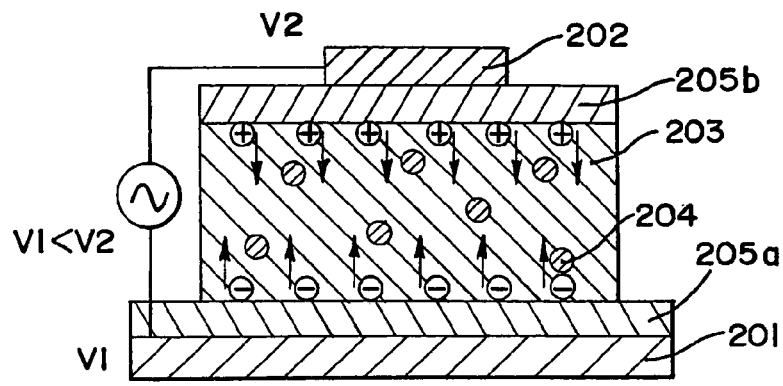
Figure 6A:
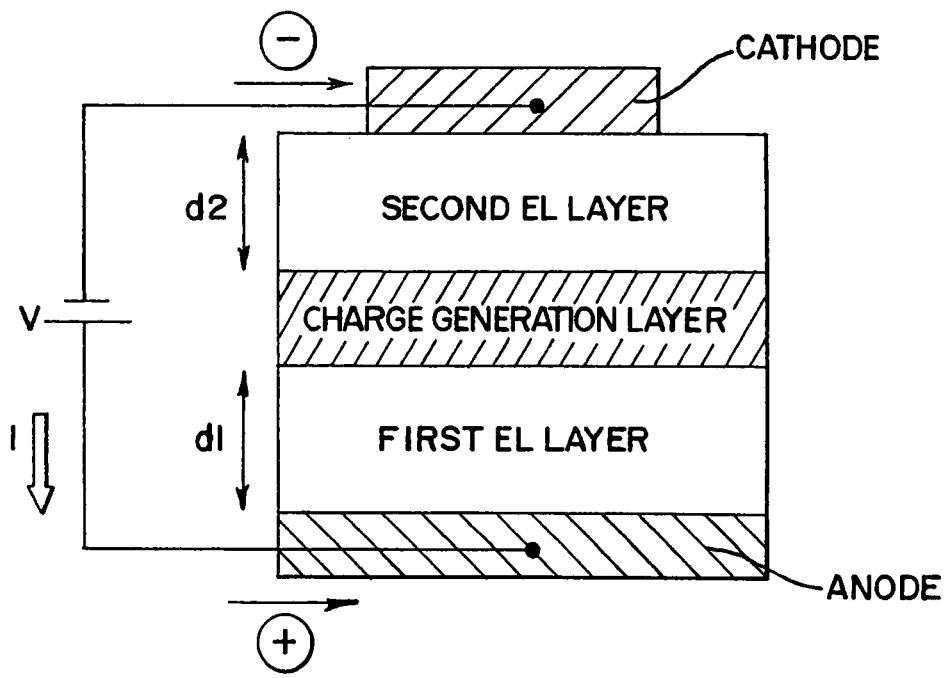
FIGS. 6A and 6B are views showing an organic EL device including conventional charge generation layer.
Figure 6B:
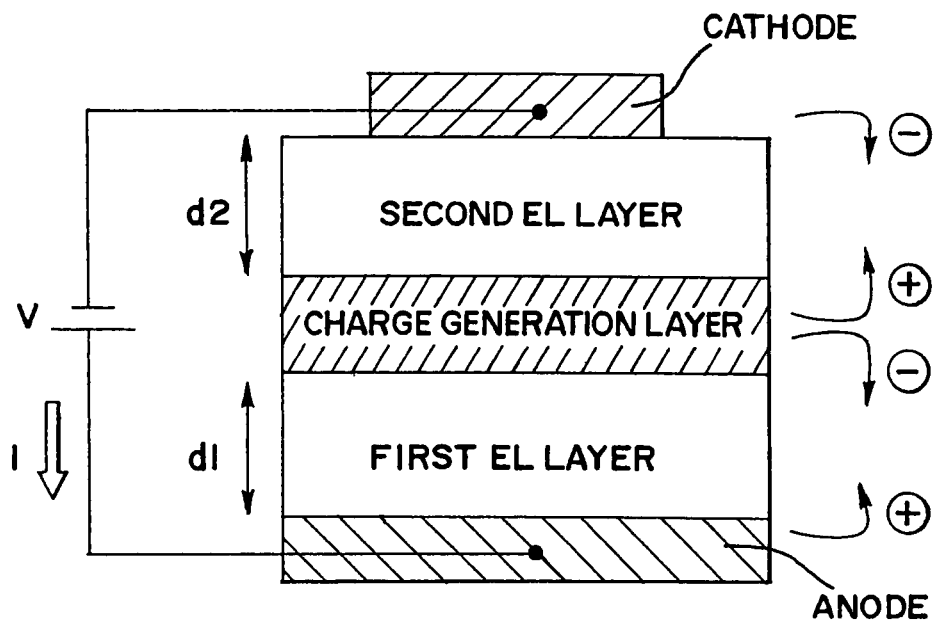

FIGS. 5A to 5C show an organic EL device of the present invention in which an alternating current power source is attached to the first electrode 201 and the second electrode 202 of the organic EL device shown in FIG. 2B. Note that the reference numerals of FIGS. 2A and 2B are cited here. Further, a device that employs a bipolar light emitting material as the EL layer 203 is used here. Furthermore, the electric potential of the first electrode is set to $V_1$, and the electric potential of the second electrode is set to $V_2$.

A case of applying an alternating current voltage to this device is explained. First, at the instant when a bias is applied such that $V_1 > V_2$, electrons are injected into the electroluminescence film 203 from each of the conductive particles 204 in the direction of the first electrode 201. Holes are injected into the electroluminescence film 203 from each of the conductive particles 204 in the direction of the second electrode 202 (see FIG. 5A). The electrons and the holes can be recombined and light emission can be achieved in a region in the relative center of the EL layer 204 (for example, a recombined hole and electrode 501) at this point. However, a portion of the electrons or a portion of the holes will flow toward their respective electrode without being recombined (for example, a hole 502 and an electrode 503).

On the other hand, the insulating layers 205a and 205b are present, and therefore carriers are not injected into the EL layer 203 from the first electrode 201 and from the second electrode 202. As a result, a portion of the electrodes or a portion of the holes will accumulate in an interface between the insulating layer 205a and the EL layer 203, or in an interface between the insulating layer 205b and the EL layer 203, respectively (see FIG. 5B).

The voltage applied is an alternating current bias, and therefore a voltage is applied to the EL device in the next instant such that $V_1 < V_2$. Although not shown in the figures, the carriers are injected at this point from each of the conductive particles 204 in directions that are opposite to those of FIG. 5A. On the other hand, the accumulated carriers of FIG. 5B flow in directions opposite to the prior ones (see FIG. 5C). As a result, the accumulated carriers can thus contribute to recombination.

This organic EL device differs from the device shown in FIGS. 1A and 1B in the following point. Namely, carriers are not injected from external electrodes due to the existence of the insulating layers 205a and 205b, and all of the carrier injection takes place from the conductive particles 204 embedded inside the device. That is, only the apparent alternating current flows (giving the appearance of intrinsic EL-like behavior). Device short circuits and the like can thus be easily prevented, and this device is extremely useful.

Note that leak currents do not develop in the devices of the present invention due to the existence of the insulating layers 205a and 205b. The devices of the present invention can therefore be expected to have improved efficiency.

Further, although it is preferable to use a sine wave, a rectangular wave, or a triangular wave as the alternating current bias waveform described above, there are no limitations placed on the waveform. It is preferable that the maximum voltage value be equal to or less than 300 V.

The basic operating principle of the present invention is described above. Examples of materials preferable for use as the structural materials of the conductive particles employed in the present invention, and examples of materials prefer-able for use as the structural materials of the EL layer are given below. Note that the present invention is not limited to these materials.

Examples of the conductive particles are gold particles, metallic colloid particles covered with an organic compound having a thiol radical, such as alkane thiol, silver particles, platinum particles, metallic particles protected by an amphipathic organic compound, ITO particles, ITO particles covered with a silane coupling agent, inorganic semiconductor particles such as CdS, CdSe, ZnO, ZnS, and CuI, carbon particles, carbon particles that have undergone surface treatment by a surfactant, carbon nanotubes, fullerenes, and the like.

An example of the structure of the electroluminescent layer is shown below. Generally used organic EL device structural materials may be utilized for the electroluminescent layer structure. However, it is preferable to form a bipolar electroluminescent layer when considering operation by using the alternating current bias.

One procedure for obtaining a bipolar electroluminescent layer is mixing a hole transporting material and an electron transporting material to form a bipolar layer. Examples of materials most widely used for the hole transporting materials are aromatic amine-based compounds (namely those which have benzene ring-nitrogen bonds therein) such as: 4,4'-bis(diphenylamino)-biphenyl (hereafter, TAD); and derivatives thereof such as: 4,4'-bis[N-(3-methylphenyl)-N-phenyl-amino]-biphenyl (hereafter, TPD); and 4,4'-bis[N-(1-naphthyl)-N-phenyl-amino]-biphenyl (hereafter, α-NPD). Also used are star burst aromatic amine compounds, including: 4,4',4''-tris(N,N-diphenyl-amino)-triphenylamine (hereafter, TDATA); and 4,4',4''-tris[N-(3-methylphenyl)-N-phenyl-amino]-triphenylamine (hereafter, MTDATA). Metal complexes are often used as the electron transporting material. Examples thereof include: metal complexes having quinoline skeletons or benzoquinoline skeletons, such as tris(8-quinolinolato)aluminum (hereafter Alq), tris(4-methyl-8-quinolinolato)aluminum (hereafter, Almq), and bis(10-hydroxybenzo[h]-quinolinate)beryllium (hereafter, Bebq); and bis(2-methyl-8-quinolinolato)-(4-hydroxy-biphenyly)-aluminum (hereafter, BAlq) that is a mixed ligand complex. The examples also include metal complexes having oxazole-based or thiazole-based ligands such as bis[2-(2-hydroxypheyl)-benzoxazolato]zinc (hereafter, $Zn(BOX)_2$) and bis[2-(2-hydroxypheyl)-benzothiazolato]zinc (hereafter, $Zn(BTZ)_2$). Other materials that are capable of transporting electrons than the metal complexes include: oxadiazole derivatives such as 2-(4-biphenylyl)-5-(4-tert-butylphenyl)-1,3,4-oxadiazole (hereafter, PBD) and 1,3-bis[5-(p-tert-butylphenyl)-1,3,4-oxadiazole-2-yl]benzene (hereafter, OXD-7); triazole derivatives such as 3-(4-tert-butylphenyl)-4-phenyl-5-(4-biphenylyl)-1,2,4-triazole (hereafter, TAZ) and 3-(4-tert-butylphenyl)-4-(4-ethylpheyl)-5-(4-biphenylyl)-1,2,4-triazole (hereafter, p-EtTAZ); and phenanthroline derivatives such as bathophenanthroline (hereafter, BPhen) and bathocuproin (hereafter, BCP).

Further, many of materials for an EL device using a polymeric compound exhibit a bipolar nature and are preferred. More specifically, examples thereof include: polyparaphenylene polymers such as poly(2,5-dialkoxy-1,4-phenylene) (hereafter, RO-PPP); polyparaphenylenevinylene polymers such as poly(2,5-dialkoxy-1,4-phenylenevinylene) (hereafter, RO-PPV); and polyfluorene polymers such as poly(9,9-dialkylfluorene) (hereafter, PDAF).

Either the first electrode or the second electrode becomes an anode, while the other electrode becomes a cathode, when operating by direct current drive. A transparent conductive inorganic compound such as ITO (indium tin oxide) or IZO (indium zinc oxide) is often used as a material for the anode provided that light is extracted from the anode. It is also possible to use an extremely thin film of a gold or the like. Materials such metals or alloys having a relatively large work function and through which light does not pass, and conductors may be used when the anode is non-transparent (for cases in which light is extracted from the cathode side). W, Ti, TiN, and the like can be given as examples. Metals and alloys that normally have a small work function are used in the cathode. Alkaline metals, alkaline earth metals, and rare earth metals may also be used, and alloys and the like that contain these metallic elements may also be utilized. Mg:Ag alloys, Al:Li alloys, Ba, Ca, Yb, Er, and the like are examples of materials that can be utilized. Further, an extremely thin film of these metals or alloys may be applied if light is extracted from the cathode.

Note that all normal conductors, such as aluminum, chromium, and titanium, may be used as the first electrode and the second electrode for cases in which the insulating layers are made thick and the organic electroluminescent device is operated by alternating current drive. However, it is necessary that at least one of the electrodes be transparent. It is therefore preferable to use a transparent conductive film such as ITO in at least one of the electrodes.

Further, inorganic insulators such as aluminum oxide and calcium fluoride, and insulating organic materials such as polyparaxylylenes can be applied as the insulating layers. At minimum, however, it is necessary that the insulating layer on the side from which light is extracted have transparency.

Embodiment 1

An organic EL device shown in FIGS. 1A and 1B that is fabricated by wet coating will be specifically described in this embodiment. First, aqueous solution of poly(ethylene dioxythiophene)/polystyrene sulfonic acid (abbrev., PEDOT/PSS) is coated by spin-coating to form a hole injection layer to have a thickness of 50 nm on a glass substrate on which ITO is formed to have a thickness of 100 nm as a first electrode.

Second, poly(2-methoxy-5-(2-ethyl-hexoxy)-1,4-phenylenevinylene) (abbrev., MEH-PPV) and gold nanoparticles having mean diameter 5 nm stabilized by alkane thiol are mixed in toluene solution. The solution is dispersed enough by using ultrasonic waves and coated 300 nm in thick by spin-coating on the above-mentioned hole injection layer to form an electroluminescent layer.

Lastly, Al:Li alloy is deposited to have a thickness of 100 nm as a second electrode. Then, an organic EL device can be formed. The organic EL device emits light by direct current driving that use ITO electrode as an anode but also emits light by alternating current voltage drive.

Embodiment 2

An organic EL device shown in FIGS. 2A and 2B will be specifically described in this embodiment. First, poly(vinyl phenol) is coated by spin-coating to have a thickness of 200 nm as an insulating layer on the glass substrate on which ITO is formed to have approximately 100 nm in thick as a first electrode. In addition, a material for solvent is isopropanol.

Then, toluene solution is prepared from 50 wt % polycarbonate as binder, 29 wt % TPD as a hole transporting material, 20 wt % 2,5-bis(1-naphthyl)-1,3,4-oxadiazole (abbrev., BND) as an electron transporting material, 1.0 wt % coumarin 6 as a luminous pigment. The toluene solution is mixed with toluene solution containing gold nanoparticles having mean diameter 5 nm stabilized by alkane thiol. Then, the solution is spin coated on the above-mentioned insulating layer to form an electroluminescent layer to have 300 nm in thick.

Further, poly(vinyl phenol) is deposited by spin-coating to have a thickness of 200 nm as an insulating layer. Lastly, aluminum is vapor-deposited to have a thickness of 200 nm as an electrode. Then, an organic EL device of the present invention can be formed. The device emits light by alternating current drive.

Embodiment 3

An organic EL device of the present invention fabricated by bonding and coating with polymer composite films containing luminous pigments and gold nanoparticles without using vapor deposition will be specifically described in this embodiment.

First, poly(vinyl phenol) is coated by spin-coating to have a thickness of 200 nm as an insulating layer on the plastic substrate (polyester substrate or polyimide substrate) on which ITO is formed 100 nm in thick as a first electrode. In addition, a material for solvent is isopropanol.

Then, toluene solution is prepared from 50 wt % polycarbonate as binder, 29 wt % TPD as a hole transporting material, 20 wt % 2,5-bis(1-naphthyl)-1,3,4-oxadiazole (abbrev., BND) as an electron transporting material, 1.0 wt % coumarin 6 as a luminous pigment. The toluene solution is mixed with toluene solution containing gold nanoparticles having mean diameter 5 nm stabilized by alkane thiol. Then, the solution is spin coated on the above-mentioned insulating layer to form an electroluminescent layer to have 300 nm in thick. Hereinafter, the substrate that is executed the deposition so far is referred to as a "first substrate".

In addition to the first substrate, a substrate having a structure that plastic substrate, ITO, insulating layer, and an electroluminescent layer laminated in this order is formed. Hereinafter, the substrate is referred to as a "second substrate". Here, spacer film having 1.0 μm in thick is positioned on the periphery portion of the first substrate prepared in advance, and the second substrate is bonded to let the electroluminescent layer is inside of the substrate.

The bonded film substrate is putted on a stainless plate of a hot plate, and weighted by superimposing another stainless plate thereon, then, heated up to 80° C. as it is. The film substrate is cooled with weighting, and got it out of the stainless plate, then, fitted a lead wiring with ITO electrode of both side (that is, a first electrode and a second electrode), and then, an organic EL device of the present invention is completed. This device emits light by alternating current drive.

According to the present invention, the current efficiency can be improved and an organic EL device having good yields can be provided at low cost.

What is claimed is:
1. A method for manufacturing an organic electroluminescent device comprising:
  forming a first electrode over a first plastic substrate;
  mixing a first organic compound a second organic compound, and a metal particle into a solvent to prepare a first solution;
  forming a first electroluminescent layer over the first plastic substrate provided with the first electrode by applying the first solution on the first electrode so that the metal particle is surrounded by a bipolar layer comprising the first organic compound and the second organic compound;

forming a second electrode over a second plastic substrate;

bonding the second plastic substrate provided with the second electrode to the first plastic substrate provided with the first electrode so that the first electroluminescent layer is interposed between the first electrode and the second electrode to form a bonded substrate, wherein a hole transporting property is higher than an electron transporting property in the first organic compound, wherein an electron transporting property is higher than a hole transporting property in the second organic compound, wherein the metal particle injects a hole and an electron to the bipolar layer by applying an alternative current so that the bipolar layer emits light.

2. A method for manufacturing an organic electroluminescent device according to claim 1, further comprising:

forming a first insulating layer between the first electrode and the first electroluminescent layer for preventing a carrier injection from the first electrode to the first electroluminescent layer, and forming a second insulating layer for preventing a carrier injection from the first electrode to the first electroluminescent layer over the second electrode.

3. A method for manufacturing an organic electroluminescent device according to claim 1, wherein the metal particle has an average diameter of 2 nm to 50 nm.

4. A method for manufacturing an organic electroluminescent device according to claim 1, further comprising: fitting a lead wiring with the first electrode and the second electrode.

5. A method for manufacturing an organic electroluminescent device according to claim 1, further comprising:

mixing the first organic compound, the second organic compound, and a conductive particle into a solvent to prepare a second solution; and forming a second electroluminescent layer over the second plastic substrate provided with the second electrode by applying the second solution over the second electrode.

6. A method for manufacturing an organic electroluminescent device according to claim 1, wherein the first plastic substrate comprise polyester or polyimide.

7. A method for manufacturing an organic electroluminescent device according to claim 1, further comprising:

forming a spacer film on a periphery portion of the first plastic substrate; and heating the bonded substrate.

8. A method for manufacturing an organic electroluminescent device according to claim 1, wherein the metal particle comprises one of gold and silver.

9. A method for manufacturing an organic electroluminescent device comprising:

forming a first electrode over a substrate;

forming a layer comprising a first organic compound, a second organic compound, and metal particles over the first electrode; and forming a second electrode over the layer, wherein the metal particles are surrounded by a bipolar layer comprising the first organic compound and the second organic compound, wherein a hole transporting property is higher than an electron transporting property in the first organic compound, and wherein an electron transporting property is higher than a hole transporting property in the second organic compound, wherein the metal particle injects a hole and an electron to the bipolar layer by applying an alternative current so that the bipolar layer emits light.

10. A method for manufacturing an organic electroluminescent device according to claim 9, wherein the metal particle comprises one of gold and silver.

* * * * *